(12) United States Patent
Hsu et al.

(10) Patent No.: US 6,772,603 B2
(45) Date of Patent: Aug. 10, 2004

(54) METHODS AND APPARATUS FOR THERMAL MANAGEMENT OF VEHICLE SYSTEMS AND COMPONENTS

(75) Inventors: John Sheungchun Hsu, Oak Ridge, TN (US); Donald Joe Adams, Knoxville, TN (US); Gui-Jia Su, Knoxville, TN (US); Laura D. Marlino, Oak Ridge, TN (US); Curtis W. Ayers, Kingston, TN (US); Chester Coomer, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/618,372

(22) Filed: Jul. 11, 2003

(65) Prior Publication Data

US 2004/0118142 A1 Jun. 24, 2004

Related U.S. Application Data

(60) Provisional application No. 60/435,812, filed on Dec. 20, 2002.

(51) Int. Cl.$^7$ .............................................. F25D 23/12
(52) U.S. Cl. .................. 62/259.2; 165/80.4; 361/688
(58) Field of Search ................... 62/259.2; 165/80.4; 361/688

(56) References Cited

U.S. PATENT DOCUMENTS

| | | | | | |
|---|---|---|---|---|---|
| 4,720,981 | A | * | 1/1988 | Helt et al. ................. | 62/113 |
| 5,220,804 | A | | 6/1993 | Tilton et al. | |
| 5,651,260 | A | * | 7/1997 | Goto et al. ................. | 62/126 |
| 6,138,469 | A | * | 10/2000 | Davidson et al. .......... | 62/259.2 |
| 6,388,882 | B1 | * | 5/2002 | Hoover et al. ............. | 361/704 |
| 6,447,270 | B1 | | 9/2002 | Schmidt et al. | |
| 6,687,122 | B2 | * | 2/2004 | Monfarad .................. | 361/687 |
| 2002/0184908 | A1 | * | 12/2002 | Brotz et al. ............... | 62/259.2 |

\* cited by examiner

Primary Examiner—William E. Tapolcai
(74) Attorney, Agent, or Firm—Kirk A. Wilson

(57) ABSTRACT

This disclosure provides an integrated thermal management system and methods for managing the cooling of electrical devices and components and the heating and cooling of the passengers' compartment in a hybrid or full electric vehicle to reduce the cost and volume of such systems.

26 Claims, 6 Drawing Sheets

METHODS AND APPARATUS FOR THERMAL MANAGEMENT OF VEHICLE SYSTEMS AND COMPONENTS

CROSS-REFERENCE TO RELATED APPLICATIONS

This application claims priority to U.S. Provisional Patent Application No. 60/435,812, filed Dec. 20, 2002, and is incorporated herein by reference.

TECHNICAL FIELD

The field of the invention is methods and apparatus for managing the cooling of electrical devices and electronic components in larger systems such as an electric vehicle.

DESCRIPTION OF THE BACKGROUND ART

The greenhouse effect and the concern over decreasing energy resources imposes a huge demand on hybrid electric and fill electric vehicle designs. Thermal management considerations must include the heating and cooling of the components of the vehicle as well as the passengers' environmental comfort levels.

Innovations in the thermal management of semiconductor devices used in power electronics have been limited. Methods for dissipating large quantities of heat have traditionally been restricted to passive cooling techniques, channel cooling, solid heat sinks, or use of fans. With the advent of larger, faster, higher current semiconductors, efficient cooling methods are required to dissipate ever-increasing amounts of waste heat. It is estimated that 55% of electronic product failures are due to excessive temperatures. Universities and industry are currently working to develop new methods to provide thermal management for circuit board assemblies as well as individual silicon dies.

The cooling in the thermal management of a vehicle is currently conducted in a piecemeal fashion. Separate cooling systems are used for the vehicle passenger compartment, the motor and the electronic devices.

New methods of cooling electronic components have also recently been proposed. Promising new technologies being examined include immersion cooling, jet impingement and spray cooling. Dielectric fluids with high heat capacities and advantageous electrical characteristics are being investigated to work with these new "two-phase" technologies. New thermosyphon cooling techniques are being applied to electronics at both circuit board and individual chip levels.

In one such method, the semiconductors are immersed in a dielectric which vaporizes as the chips increase in temperature. The vapor condenses as it rises and is cooled by a water pipe, changes back to liquid phase, and then drops back into the pool. The temperature difference between the vapor and the liquid is negligible. For a lower vapor temperature, the water-cooled heat exchanger is comparatively large for a given heat extracted from the multichip modules.

In another arrangement, the semiconductor chips are not totally immersed in the dielectric fluid. Downward movement of the liquid is caused by gravity. On system start-up, the pump must initially be turned on to fill the reservoir before energizing the chips.

Other methods of cooling semiconductor components include impingement by jets of cooling liquid, as well as cooling by spraying a coolant directly on the chips. In both cases the liquid can be vaporized, cooled, returned to a liquid state and recirculated.

A thermosyphon assembly may be used to implement a two-phase liquid cooling system by indirect contact with electronics. In this system the density difference between the liquid and vapor creates a pressure head, which drives the flow through the loop so no driving force is needed. This method is being used to dissipate heat from PC processors.

Research is being performed in spray cooling of IGBT power switching devices with results of up to 34% improvement seen in their power handling capabilities. Water is being utilized as the coolant in these systems with the semiconductors coated with a conformal dielectric. Additionally, the technology involves the construction of the nozzle array from silicon by reactive ion etching.

Yet another approach for cooling semiconductors involves heat pipes imbedded in an evaporator. A heat pipe includes a vacuum tight envelope, a wick structure and a working fluid. The heat pipe is evacuated and then back-filled with a small quantity of working fluid. The atmosphere inside the heat pipe is set by an equilibrium of liquid and vapor. As heat enters the evaporator, the equilibrium is upset generating vapor at a slightly higher pressure. This vapor travels to the condenser end where the slightly lower temperatures cause the vapor to condense giving up its latent heat of vaporization. The condensed fluid is then returned to the evaporator through capillary action developed in the wick structure. This continuous cycle transfers large quantities of heat with very low thermal gradients. A heat pipe's operation is passive, being driven only by the heat transferred.

Heat pipes have been embedded in power amplifier modules. In one application the heat pipes were 0.375" in diameter and flattened into grooves in the heat sink base with a thermal epoxy at the interface. This approach reduces the thermal resistance of the heat sink by 50%.

In loop thermosyphons, a circuit board is essentially immersed in the coolant and vapor chambers. A vapor chamber is a vacuum vessel with a wick structure lining the inside walls that is saturated with a working fluid. As heat is applied, the fluid at that location immediately vaporizes and the vapor rushes to fill the vacuum. Wherever the vapor comes into contact with a cooler wall surface it will condense, releasing its latent heat of vaporization. The condensed fluid returns to the heat source via capillary action, to be vaporized again and repeat the cycle. The capillary action of the wick enables the vapor chamber to work in any orientation with respect to gravity. A vapor chamber heat sink consists of a vapor chamber integrated with cooling fins and pins. Due to the way the vapor chamber operates, the heat source can be placed anywhere on the base without affecting its thermal resistance. In addition, there can be multiple heat sources dissipating the same or different amounts of power. The rate of fluid vaporization at each source will stabilize and the vapor chamber will be nearly isothermal.

The cooling approaches discussed above are solving thermal problems in a piecemeal fashion. The present invention solves the cooling and heating problems of hybrid and full electric vehicles from a system approach. In doing so, the system may be designed so that individual electrical devices and mechanical components perform multiple functions. This results in a lower cost, smaller volume, and higher efficiency system.

SUMMARY OF THE INVENTION

The invention provides a total thermal management system that includes heating and cooling of critical electrical and electronic components as well as controlling the temperature of the passenger compartment of a vehicle.

The invention provides a total thermal management system that shares hardware for multiple functions.

The invention provides a total thermal management system for hybrid electric vehicles.

The invention provides a total thermal management system for full electric vehicles.

The invention provides a total thermal management system that shares a digital signal processor (DSP) for monitoring and control functions as well as controlling an inverter.

The invention provides a total thermal management system that shares a compressor and condenser for multiple thermal management functions.

The invention provides a total thermal management system that shares an inverter for multiple functions. For example, the invention provides for an inverter controlling both a traction motor and a compressor motor.

The invention provides a system for cooling dies of power semiconductors and an inverter which will withstand the start up conditions of the system.

The invention provides for direct cooling of motors with shaft seals.

The invention provides for indirect cooling of motors without shaft seals.

One embodiment of the invention is an integrated thermal management system having; a refrigeration subsystem having a refrigerant and multiple components, an electrical subsystem having multiple components, an electronic control subsystem having multiple components, wherein said refrigeration subsystem is in thermal communication with at least one of the components of the electrical subsystem and at least one of the components of the electronic control subsystem, and wherein said electrical subsystem is in thermal communication with at least one of the components of the refrigeration subsystem and in electronic communication with at least one of the components of said electronic control subsystem, and wherein said electronic control subsystem is in electronic communication with at least one of the components of the electrical subsystem and at least one of the components of the refrigeration system. The refrigerant can be any phase change working fluid, as defined in ASHRAE Standard 34, that transfers heat; such as halogenated compounds (CFC's) of the methane, ethane, and propane series, cyclic organic compounds, zeotropes, azeotropes, nitrogen compounds, inorganic compounds and elements such as water, and unsaturated organic compounds.

DETAILED DESCRIPTION

This invention is described first in relation to the cooling and heating of the hybrid and the full electric vehicles from a system standpoint. This allows individual components in the system to perform multiple functions, thereby resulting in a lower cost, smaller volume, and higher efficiency system.

In a refrigeration cycle, the refrigerant liquid is initially at a higher pressure P2>P1 (where P2 is the condenser pressure and P1 is the evaporator pressure) and a higher temperature, $T_{cond}>T_{evap}$ (where Tcond is the the condenser temperature excluding the superheated vapor portion and Tevap is the evaporator temperature). The liquid flows through an orifice or a capillary reducing its pressure to a lower pressure P1 as part of a constant enthalpy process. An expansion then takes place in an evaporator that gradually changes the liquid to vapor. The evaporator has a lower pressure P1 and a lower temperature $T_{evap}$. When the refrigerant in the evaporator absorbs the heat, the enthalpy of the refrigerant increases. The refrigerant cycle then uses a compressor to compress the low-temperature refrigerant vapor into a high-temperature vapor. The refrigerant vapor then starts to dissipate its heat in a condenser, which gradually changes the refrigerant back to a liquid phase. These processes will be applied below to electrical devices and to the electronic components in a system, such as a vehicle.

Figure 1A:
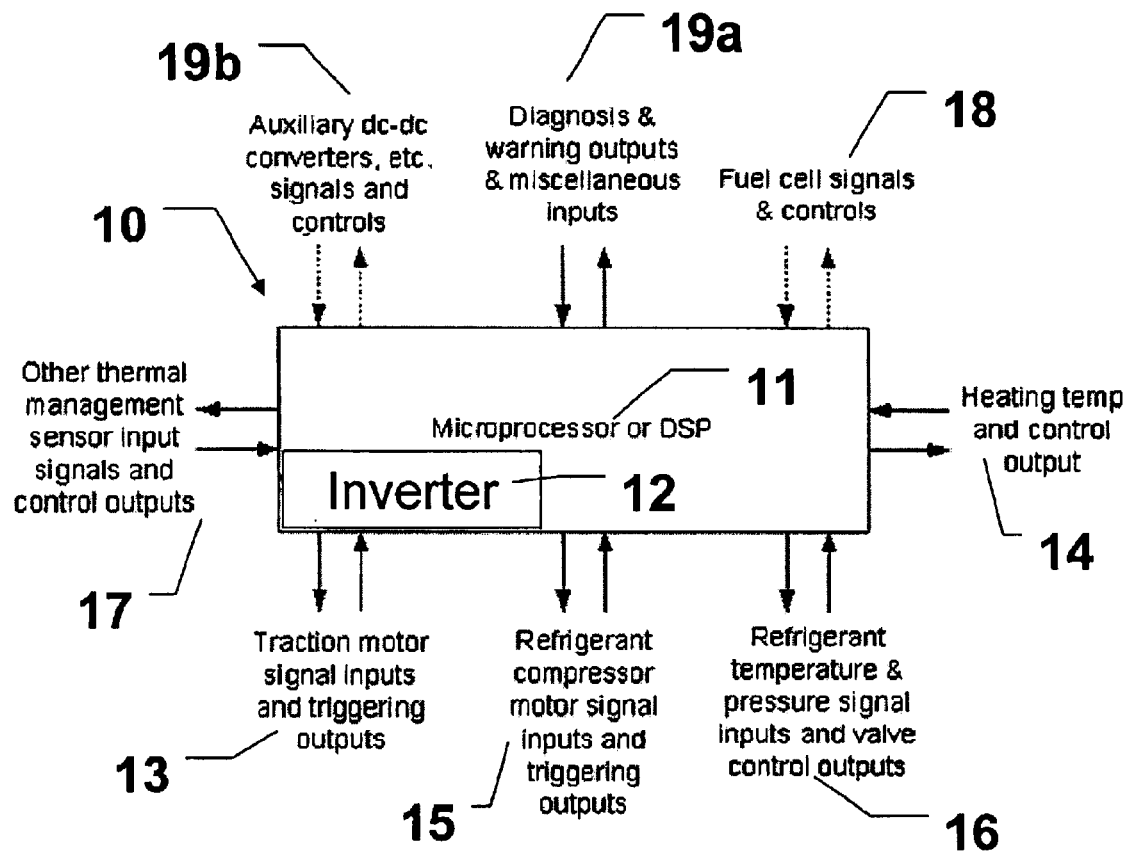
FIGS. 1a and 1b are block diagrams of the system and subsystems of the present invention for controlling the system heating and cooling requirements of a hybrid or full electric vehicle.
Figure 1B:
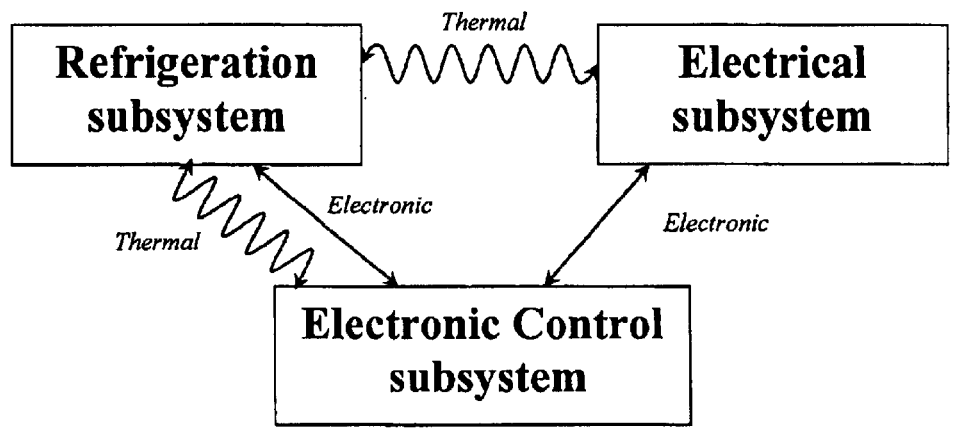

Referring first to FIG. 1a, an integrated thermal management system is shown in which all the heating and cooling sensor signals and control outputs are managed by a single controller 10 including a digital signal processor (DSP) 11 and an inverter 12. The DSP 11 is utilized to control inputs and monitor the outputs of a traction motor 13 for the vehicle, as well as the inputs and outputs for the passenger compartment heating and cooling system 14, a compressor motor 15 and a refrigerant system 16 for cooling electrical subassemblies and electronic components. In addition, the DSP 11 manages other thermal sensors and control devices 17 on the vehicle, fuel cell signals and controls 18, diagnosis and warning devices 19a, as well as auxiliary dc-dc converters 19b. FIG. 1b is a block diagram of the communication paths between the three thermal management subsystems.

By controlling the thermal and motor controls with a single DSP 11, efficient methods can be realized to enhance control of all systems. For example, an impending failure of a power switching device in the inverter, resulting in increased current and rising temperatures, could be sensed and controlled via the DSP 11. The DSP 11 could respond by decreasing the current through the power switching devices or perhaps by increasing of the flow rate or volume of the coolant to the power switching devices.

Figure 2:
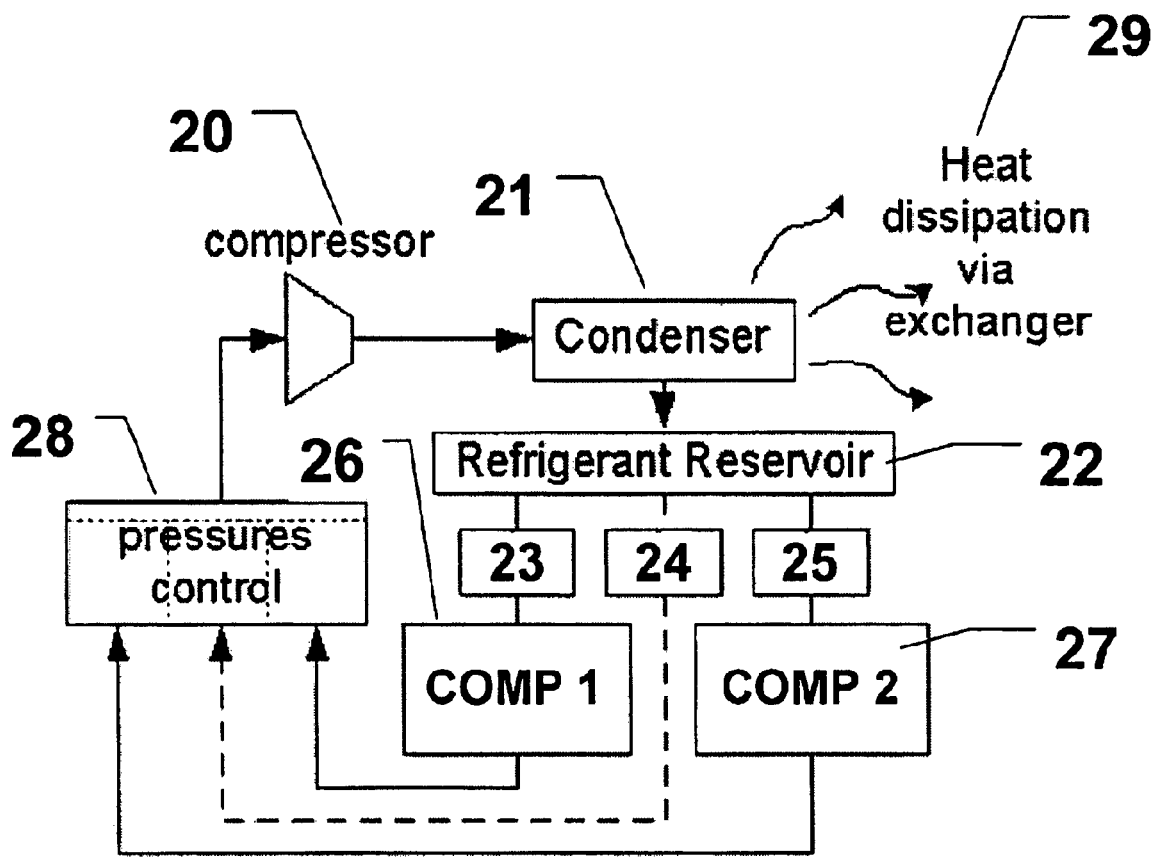
FIG. 2 is a block diagram of a central compressor and condenser system in the system of FIG. 1.

FIG. 2 shows a total thermal management system using a central compressor 20, condenser 21, and refrigerant reservoir 22. The refrigerant from the reservoir 22 is distributed through different orifices 23, 24, 25 or capillary tubes and valves to various system components 26, 27. The components 26, 27 can be an inverter, a motor or an evaporator, such as the evaporator for the interior air conditioning. The back pressures of the components 26, 27 are individually regulated by the pressure control 28 for maintaining the proper temperature of each component 26, 27. The heat exchanger 29 dissipates heat from the condenser 21. The heat exchanger can be a fan blowing air through the condenser or other means for exchanging heats.

The compressor 20 can be driven by an electric motor or by an engine. The heat produced by the components 26, 27 being cooled is dissipated through the condenser 21. Because the temperature of the condenser 21 is reasonably high, this makes the heat dissipation more effective and results in a more compact and cost-effective cooling system.

When the compressor 20 is driven by the compressor motor 15 (FIG. 1) controlled by the inverter 12 (FIG. 1), the cooling of the inverter's power electronic components, such as the main switching semiconductor dies, must be cooled during the initial start-up period, prior to the cooling system becoming fully functional. To assure the power switching devices are not overheated, their dies must be submersed in the refrigerant for this short start-up period.

Figure 3:
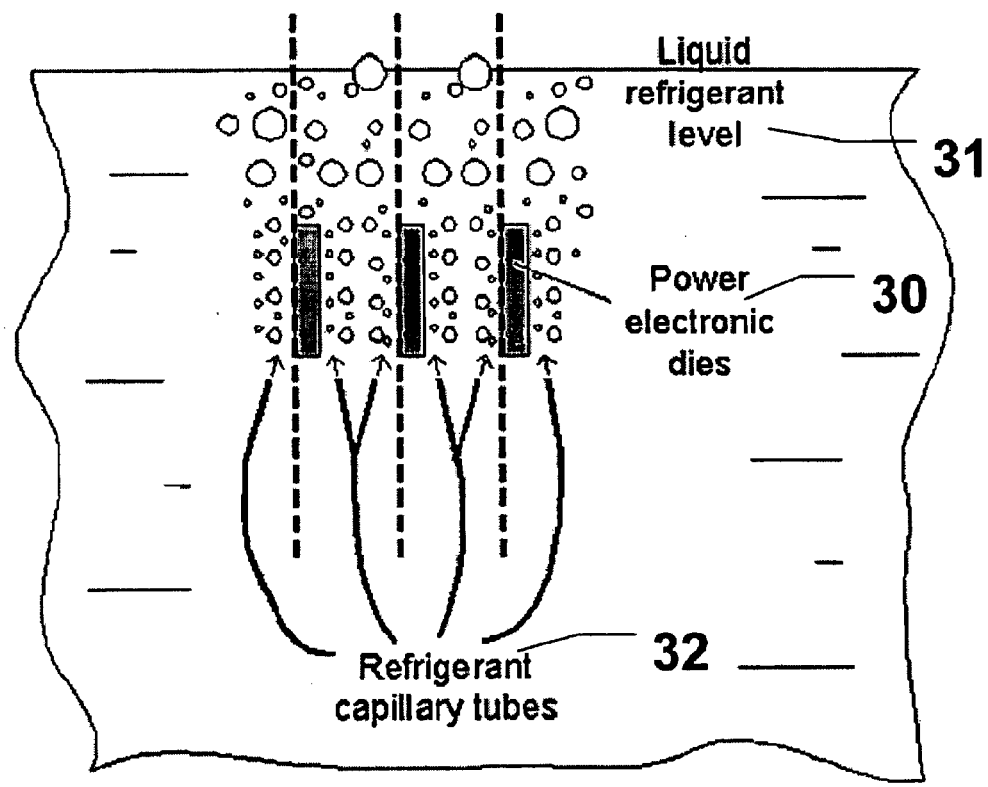
FIG. 3 is a schematic diagram illustrating the cooling of the semiconductor dies for the system of FIG. 1.

FIG. 3 shows an arrangement of dies 30 for power electronic semiconductor components, which are submerged in a bath of liquid refrigerant 31. During normal operation, the refrigerant 31 coming from the reservoir 22 (see FIG. 2) is used to blow off the vapor bubbles. Capillary tubes 32 or other types of nozzles can be utilized. The refrigerant vapor can also be used to cool the less critical components of the power electronic assembly.

Figure 4:
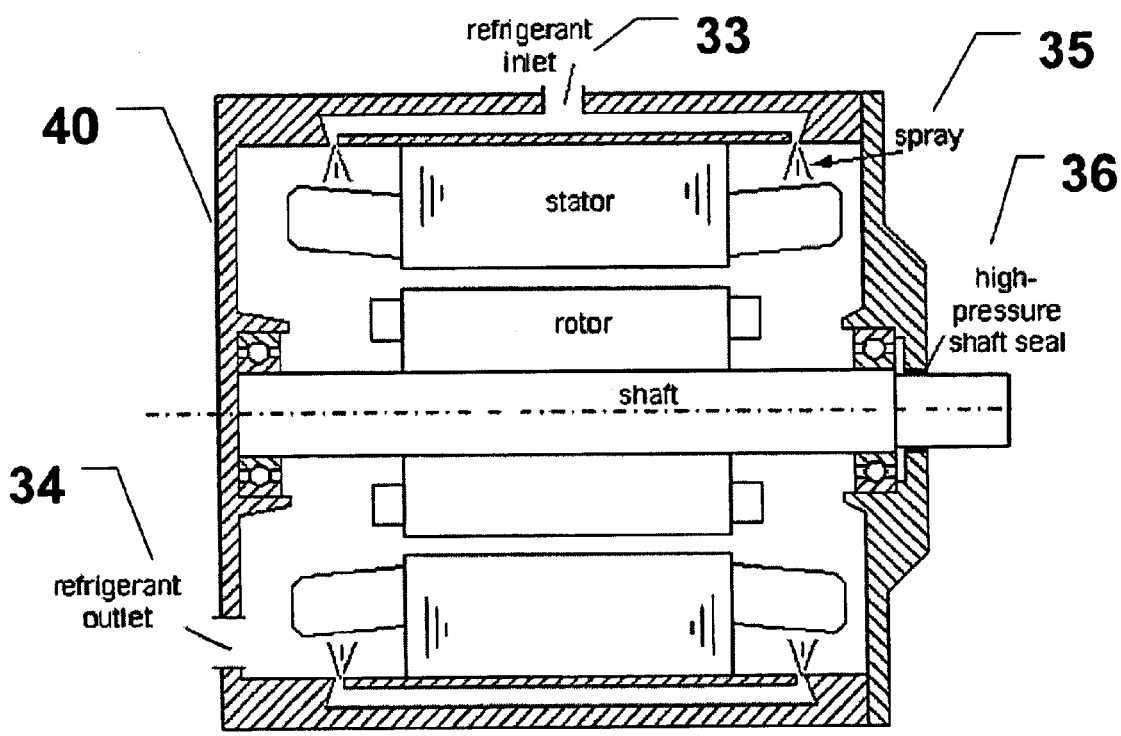
FIG. 4 is a schematic longitudinal section view illustrating the cooling of a motor with a shaft seal in the system of FIG. 1.

Motors can also be cooled directly by spraying liquid refrigerant onto the windings and cores in the motor frame as shown in FIG. 4. The locations of the inlet 33, outlet 34 and spray nozzles 35 can be arranged as shown in FIG. 4. The outside of the motor housing 40 is wrapped with thermal insulation (not shown) if the motor housing 40 is cooler than the ambient temperature.

Advantages in directly cooling a motor with a refrigerant, as opposed to cooling power electronic assemblies in this manner are: (1) the motor does not contain critical components such as IGBTs or MOSFETs that have very small thermal capacities and low temperature limits, and (2) higher heat transfer among components take place. This makes the spray positioning arrangement less critical than in a power electronics assembly. In this construction, a compressor is driven by the motor, and it is necessary to provide a shaft seal 36 as seen in FIG. 4.

Figure 5:
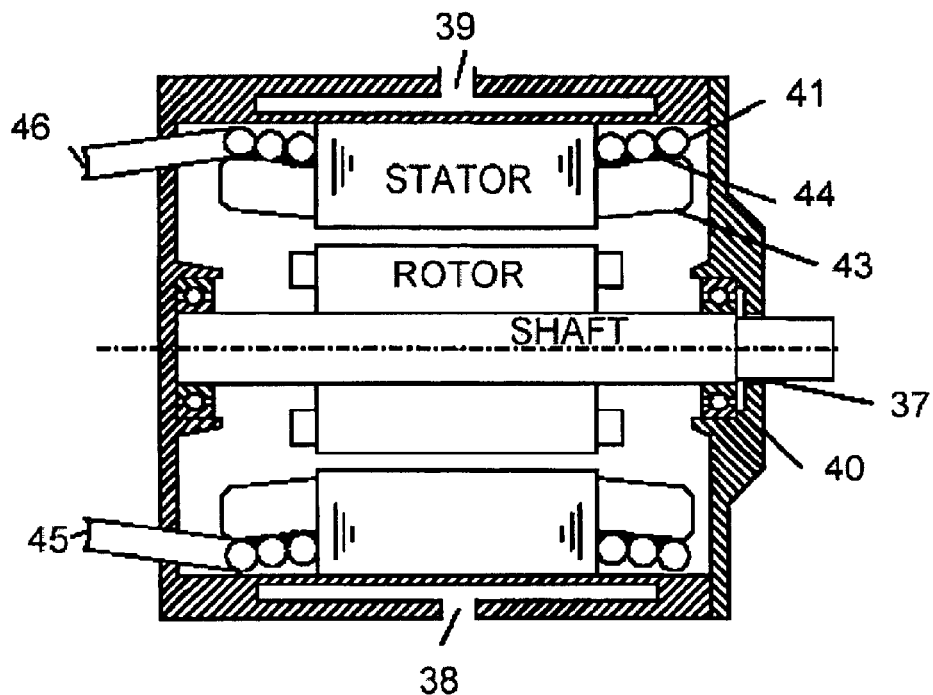
FIGS. 5 and 6 are schematic section views illustrating the cooling of a motor without a shaft seal in the system of FIG. 1.
Figure 6:
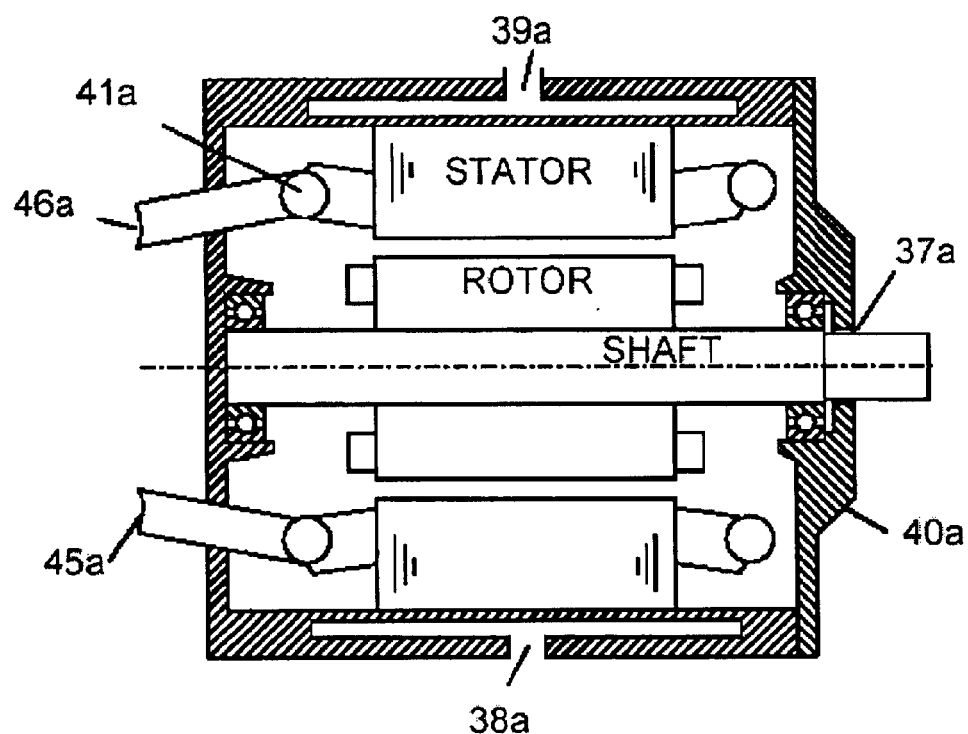

FIGS. 5 and 6 illustrate an approach which does not require shaft seals at locations 37 and 37a. A built-in evaporator has a liquid inlet 39, or 39a and a vapor outlet 38 or 38a formed in a motor housing 40 or 40a and evaporators 41 or 41a, which are wrapped around the end turns of the stator windings 43. This allows for the elimination of the shaft seal from locations 37 and 37a shown in FIGS. 5 and 6. The outside of the motor housing 40, 40a is wrapped with thermal insulation (not shown) if the housing 40, 40a is cooler than the ambient temperature. The wrapped-around evaporators 41 or 41a can be constructed of soft metal tubes, such as those made of copper or aluminum, which can be slid around the end turn and then tightened to follow the contour of the end turn. Thermal paste 44 is applied to the voids between the wrapped-around evaporators 41 and the end turns 43. FIG. 6 shows an option where the wrapped-around evaporators 41a are tied to the end turns. Again, no high-pressure shaft seal is required at location 37a.

Figure 7:
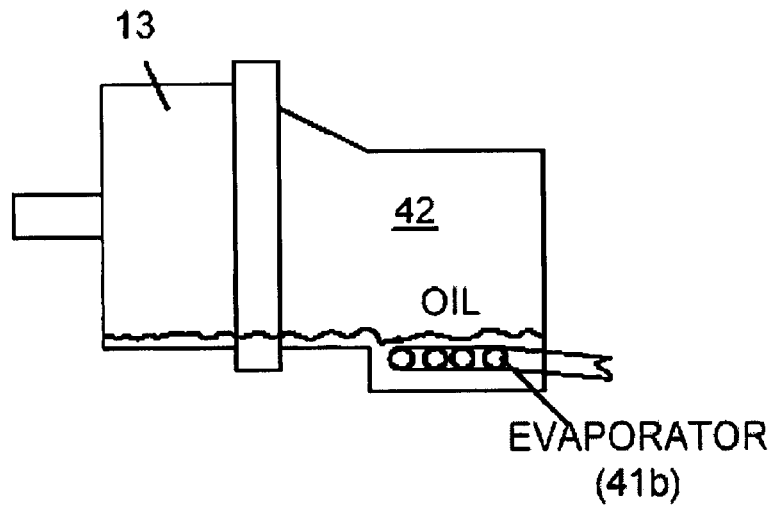
FIG. 7 is a schematic view illustrating indirect cooling of a traction motor and transmission in the system of FIG. 1.

FIG. 7 shows an example of indirect cooling. An evaporator 41b cools the oil that is used for cooling the vehicle transmission 42 and traction motor 13 without the need for high pressure seals and chambers.

Figure 8:
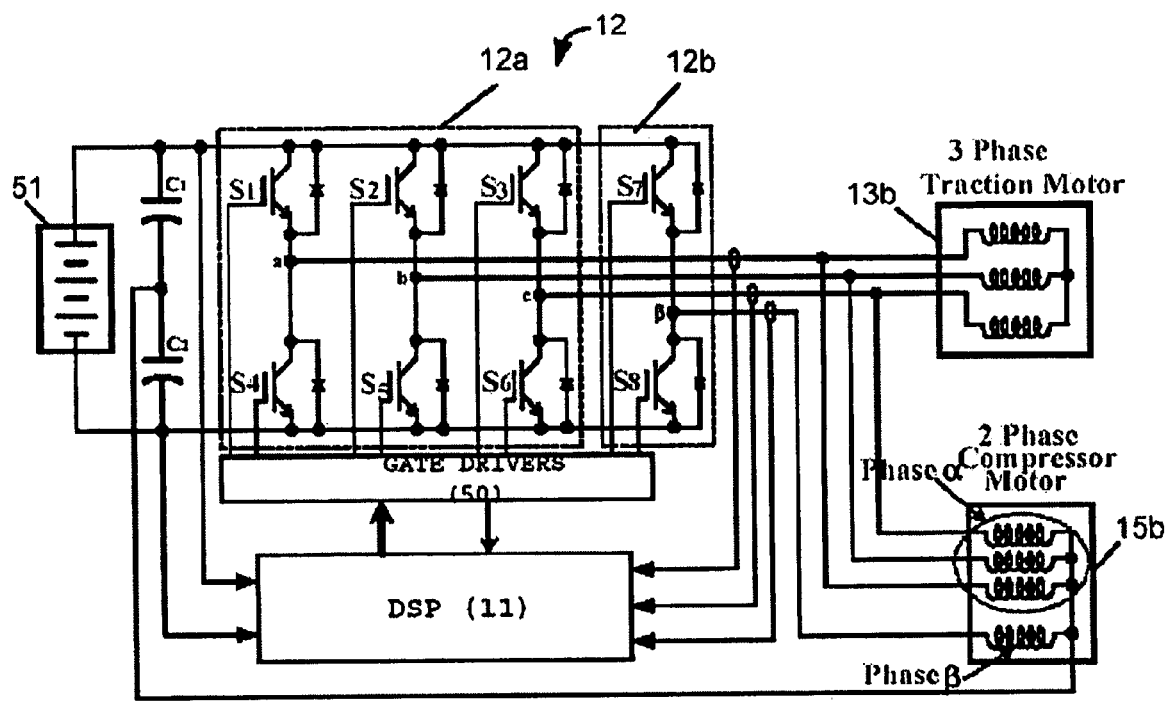
FIGS. 8 and 9 are electrical schematic diagrams of an inverter and its control circuits. The inverter is shared by a traction motor and a compressor motor in the system of FIG. 1.

FIG. 8 shows a traction motor 13b and compressor motor 15b controlled from one inverter 12. The DSP 11 controls the inverter 12 through gate driver circuitry 50. The inverter 12 is connected to a DC source 51 and two DC bus capacitors, $C_1$, $C_2$. Power switching devices S1–S6 form the main inverter 12 for the traction motor 13b which is shared by the compressor motor 15b. Two other switching devices S7–S8 are provided in a fourth leg 12b to drive the compressor motor 15b. The zero-sequence components of the three phases from the main inverter 12a are used to drive one phase (Phase α) of a two-phase compressor motor 15b and the other phase (phase β) of the two-phase compressor motor 15b is driven by the single leg 12b and the center tap of the DC bus capacitors $C_1$, $C_2$. The compressor motor 15b can be either an induction motor or a full-wave brushless dc motor.

Figure 9:
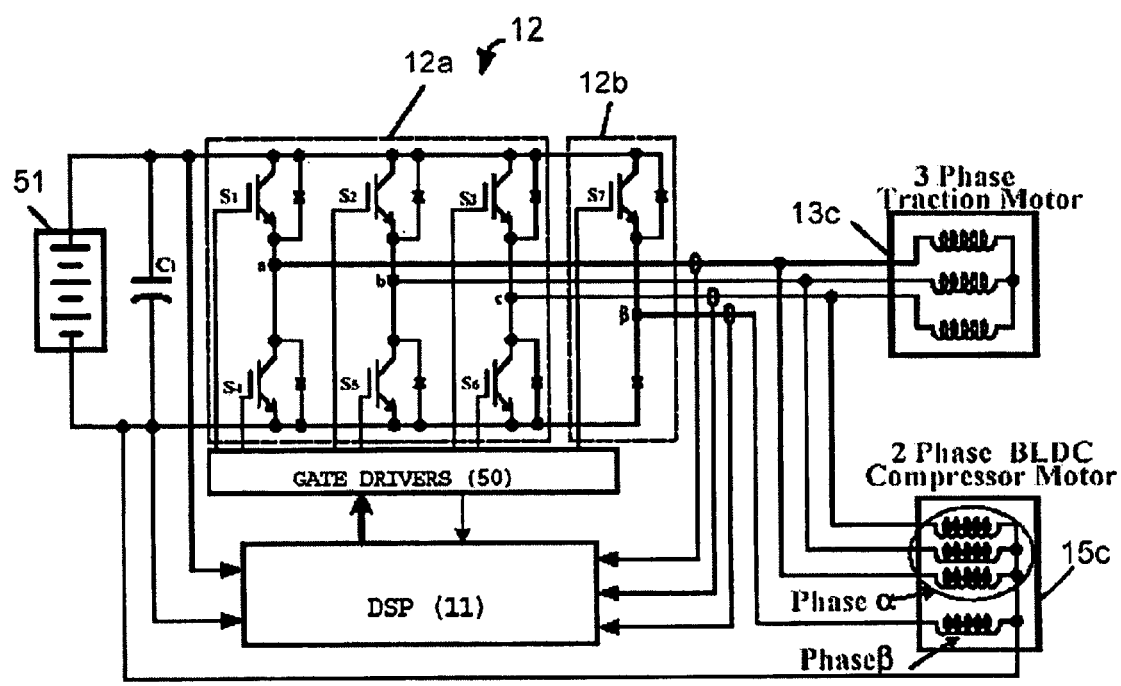

FIG. 9 shows a three and one-half leg inverter 12 which can be shared by the main traction motor 13c and by a brushless DC compressor motor 15c, but not by induction motors. In this construction, only one capacitor, $C_1$ is used in the DC bus, and only one power switching device S7 is included in the extra leg 12b of the inverter 12. The two-phase motor 15c is a half-wave brushless dc (BLDC) motor.

From this description and the drawings, it can be seen that the invention provides a total thermal management system that includes heating and cooling of critical electrical and electronic components as well as controlling the temperature of the passenger compartment of the vehicle. The invention provides a total thermal management system that shares hardware for multiple functions. The invention provides a total thermal management system for hybrid electric vehicles and full electric vehicles. A digital signal processor (DSP) is used for multiple monitoring and control functions. The thermal management system shares a compressor and condenser. The invention provides a total thermal management system that shares an inverter. For example, the invention provides for sharing of an inverter by a traction motor and a compressor motor. The invention provides a system for the cooling of power semiconductor dies in an inverter which will withstand the system start-up conditions. The invention provides for direct cooling of motors with shaft seals, and the invention also provides for indirect cooling of motors without shaft seals.

We claim:

1. An integrated thermal management system comprising;
   a refrigeration subsystem having a refrigerant and multiple components,
   an electrical subsystem having multiple components,
   an electronic control subsystem having multiple components,
   wherein said refrigeration subsystem is in thermal communication with at least one of the components of the electrical subsystem and at least one of the components of the electronic control subsystem,
   wherein said electrical subsystem is in thermal communication with at least one of the components of the refrigeration subsystem and in electronic communication with at least one of the components of said electronic control subsystem, and
   wherein said electronic control subsystem is in electronic communication with at least one of the components of the electrical subsystem and at least one of the components of the refrigeration system.

2. The integrated thermal management system of claim 1 wherein said thermal communication is direct refrigerant contact.

3. The integrated thermal management system of claim 1 wherein said electronic communication further comprises digital signal processing signals.

4. The integrated thermal management system of claim 1 wherein said refrigeration subsystem further comprises at least one device selected from the group consisting of refrigerant compressors, refrigerant control devices, refrigerant reservoirs, refrigerant condensers, refrigerant evaporators, and heat exchangers, each device responsive to said electronic control subsystem.

5. The integrated thermal management system of claim 1 wherein said electrical subsystem further comprises at least one device selected from the group consisting of inverters, traction motors, refrigerant compressor motors, fuel cells, auxiliary converters, gate drivers, and power electronic devices, each device responsive to said electronic control subsystem.

6. The integrated thermal management system of claim 5 wherein said refrigerant evaporates in direct contact with the windings and core of said traction motors.

7. The integrated thermal management system of claim 5 wherein said refrigerant evaporates in indirect contact with the windings and core of said traction motors.

8. The integrated thermal management system of claim 5 wherein said refrigerant evaporates in indirect contact with vehicle transmission oil.

9. The integrated thermal management system of claim 5 wherein said inverter is a four leg inverter using zero-sequence components to drive at least one motor selected from the group consisting of induction and brushless DC motors.

10. The integrated thermal management system of claim 5 wherein said inverter is a three and one-half leg inverter using zero-sequence components to drive at least one brushless DC motor.

11. The integrated thermal management system of claim 1 wherein said electronic control subsystem further comprises at least one device selected from the group consisting of digital signal processors, inverter controllers, sensors, and control wiring.

12. The integrated thermal management system of claim 11 wherein said sensors are selected from the group consisting of pressure sensors, temperature sensors, current sensors, and voltage sensors.

13. The integrated thermal management system of claim 1 wherein said electronic control subsystem controls the refrigeration subsystem devices and electrical subsystem devices within set limits of temperature, pressure, current, and voltage.

14. A method of managing the thermal environment of a vehicle comprising;
providing a refrigeration subsystem having a refrigerant and multiple components,
providing an electrical subsystem having multiple components,
providing an electronic control subsystem having multiple components,
wherein said refrigeration subsystem is in thermal communication with at least one of the components of the electrical subsystem and at least one of the components of the electronic control subsystem,
wherein said electrical subsystem is in thermal communication with at least one of the components of the refrigeration subsystem and in electronic communication with at least one of the components of said electronic control subsystem, and
wherein said electronic control subsystem is in electronic communication with at least one of the components of the electrical subsystem and at least one of the components of the refrigeration system.

15. The method of claim 14 wherein said thermal communication is direct refrigerant contact.

16. The method claim 14 wherein said electronic communication further comprises digital signal processing signals.

17. The method claim 14 wherein said refrigeration subsystem further comprises at least one device selected from the group consisting of refrigerant compressors, refrigerant control devices, refrigerant reservoirs, refrigerant condensers, refrigerant evaporators, and heat exchangers, each device responsive to said electronic control subsystem.

18. The method of claim 14 wherein said electrical subsystem further comprises at least one device selected from the group consisting of inverters, traction motors, refrigerant compressor motors, fuel cells, auxiliary converters, gate drivers, and power electronic devices, each device responsive to said electronic control subsystem.

19. The method of claim 18 wherein said refrigerant evaporates in direct contact with the windings and core of said traction motors.

20. The method of claim 18 wherein said refrigerant evaporates in indirect contact with the windings and core of said traction motors.

21. The method of claim 18 wherein said refrigerant evaporates in indirect contact with vehicle transmission oil.

22. The method of claim 18 wherein said inverter is a four leg inverter using zero-sequence components to drive at least one motor selected from the group consisting of induction and brushless DC motors.

23. The method of claim 18 wherein said inverter is a three and one-half leg inverter using zero-sequence components to drive at least one brushless DC motor.

24. The method of claim 14 wherein said electronic control subsystem further comprises at least one device selected from the group consisting of digital signal processors, inverter controllers, sensors, and control wiring.

25. The method of claim 24 wherein said sensors are selected from the group consisting of pressure sensors, temperature sensors, current sensors, and voltage sensors.

26. The method of claim 14 wherein said electronic control subsystem controls the refrigeration subsystem devices and electrical subsystem devices within set limits of temperature, pressure, current, and voltage.

* * * * *